(12) United States Patent
Ramsay et al.

(10) Patent No.: US 9,632,137 B2
(45) Date of Patent: Apr. 25, 2017

(54) SERIAL WIRE DEBUG BRIDGE

(71) Applicant: Apple Inc., Cupertino, CA (US)

(72) Inventors: James D. Ramsay, San Jose, CA (US); Manu Gulati, Saratoga, CA (US); Mitchell Palmer Lichtenberg, Jr., Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 180 days.

(21) Appl. No.: 14/693,116

(22) Filed: Apr. 22, 2015

(65) Prior Publication Data

US 2016/0313396 A1 Oct. 27, 2016

(51) Int. Cl.
  *G06F 11/00* (2006.01)
  *G01R 31/317* (2006.01)
  *G06F 11/22* (2006.01)

(52) U.S. Cl.
  CPC .... *G01R 31/31705* (2013.01); *G06F 11/2221* (2013.01)

(58) Field of Classification Search
  CPC .................. G01R 31/31705; G06F 11/2221
  See application file for complete search history.

(56) References Cited

U.S. PATENT DOCUMENTS

| | | | |
|---|---|---|---|
| 6,895,530 B2 * | 5/2005 | Moyer | G06F 11/3664 714/25 |
| 8,161,328 B1 | 4/2012 | Wilshire | |
| 8,601,315 B2 | 12/2013 | Ehrlich et al. | |
| 8,656,220 B2 | 2/2014 | Lee et al. | |
| 2013/0159776 A1* | 6/2013 | Gilday | G06F 11/3636 714/37 |
| 2013/0212425 A1 | 8/2013 | Blaine et al. | |
| 2014/0013145 A1* | 1/2014 | Hopkins | G06F 1/3206 713/330 |
| 2016/0070634 A1* | 3/2016 | Shirlen | G06F 11/3495 714/45 |

FOREIGN PATENT DOCUMENTS

CN 100392617 6/2008

OTHER PUBLICATIONS

Office Action in Taiwanese Application No. 105109262 mailed Sep. 26, 2016, 22 pages.

* cited by examiner

*Primary Examiner* — Philip Guyton
(74) *Attorney, Agent, or Firm* — Meyertons, Hood, Kivlin, Kowert & Goetzel, P.C.; Erik A. Heter

(57) ABSTRACT

An integrated circuit (IC) having a bridge for interfacing a debugger and method of operating the same is provided. In one embodiment, an IC includes a debug control circuit and a debug interface block (DIB) implemented thereon. The DIB is coupled to the debug control circuit. The IC also includes an interface for a debugger and a number of interfaces for external circuits, each of the interfaces being coupled to the debug control circuit. The debug control circuit may function as a bridge for coupling an external debugger to the DIB and to external circuits coupled to the IC through corresponding ones of the interfaces. The debug control circuit may establish a connection between the debugger and one of the external circuits. Communications between the debugger and the external circuit may be conducted while bypassing the DIB.

20 Claims, 4 Drawing Sheets

SERIAL WIRE DEBUG BRIDGE

BACKGROUND

Technical Field

This disclosure is directed to integrated circuits, and more particularly, to providing debug access to integrated circuits.

Description of the Related Art

Boundary scan testing was originally developed to test connections between integrated circuits (IC's) and printed circuit boards (PCB's) in the absence of other ways to probe them. Boundary scan is based on the Joint Test Action Group (JTAG) specification, which is also known as the Institute of Electrical and Electronic Engineers (IEEE) Standard 1149.1. In particular, the IEEE 1149.1 standard provided a mechanism for providing access to pins of an IC to determine the presence of proper connections.

Although the IEEE 1149.1 standard was originally developed for boundary scan, its uses have expanded to other areas. For example, JTAG ports are now used to obtain access to an IC for debugging during the development phase. For example, a JTAG controller may be used to access portions of an IC while conducting tests of system software in a new design.

Since some IC's have limited pin counts that can be devoted to supporting test and debug, the serial wire debug (SWD) interface has been developed. The SWD interface is an interface that utilizes only two pins but nevertheless provides access to internal debug interface blocks. Despite the lower pin count, the SWD interface may provide equivalent functionality to higher pin count JTAG interfaces.

SUMMARY

An integrated circuit (IC) having a bridge for interfacing a debugger and method of operating the same is provided. In one embodiment, an IC includes a debug control circuit and a debug interface block (DIB) implemented thereon. The DIB is coupled to the debug control circuit. The IC also includes an interface for a debugger and a number of interfaces for external circuits, each of the interfaces being coupled to the debug control circuit. The debug control circuit may function as a bridge for coupling an external debugger to the DIB or to external circuits coupled to the IC through one of the corresponding interfaces. The debug control circuit may be used to establish a connection between the debugger and one of the external circuits. After the connection has been established, subsequent communications may be conducted while bypassing the DIB.

In one embodiment, connections between the external debugger and external circuits coupled to the debug control circuit via the interfaces may be brought online or taken offline without affecting the other connections. For example, a debugger may be connected to and communicating with first and second external circuits. The first external circuit may be powered down (thereby removing its connection to the debugger) with no effect on the connection between the debugger and second external circuit, or any other connections (e.g., between the debugger and the DIB via the debug control circuit).

In one embodiment, the DIB may be in a different power domain than the debug control circuit, with the DIB being power gate-able. Connections between the debugger and one or more external circuits may be established by the debug control circuit. Thereafter, communications may bypass the DIB, even if the DIB is powered down.

BRIEF DESCRIPTION OF THE DRAWINGS

The following detailed description makes reference to the accompanying drawings, which are now briefly described.

Figure 1:
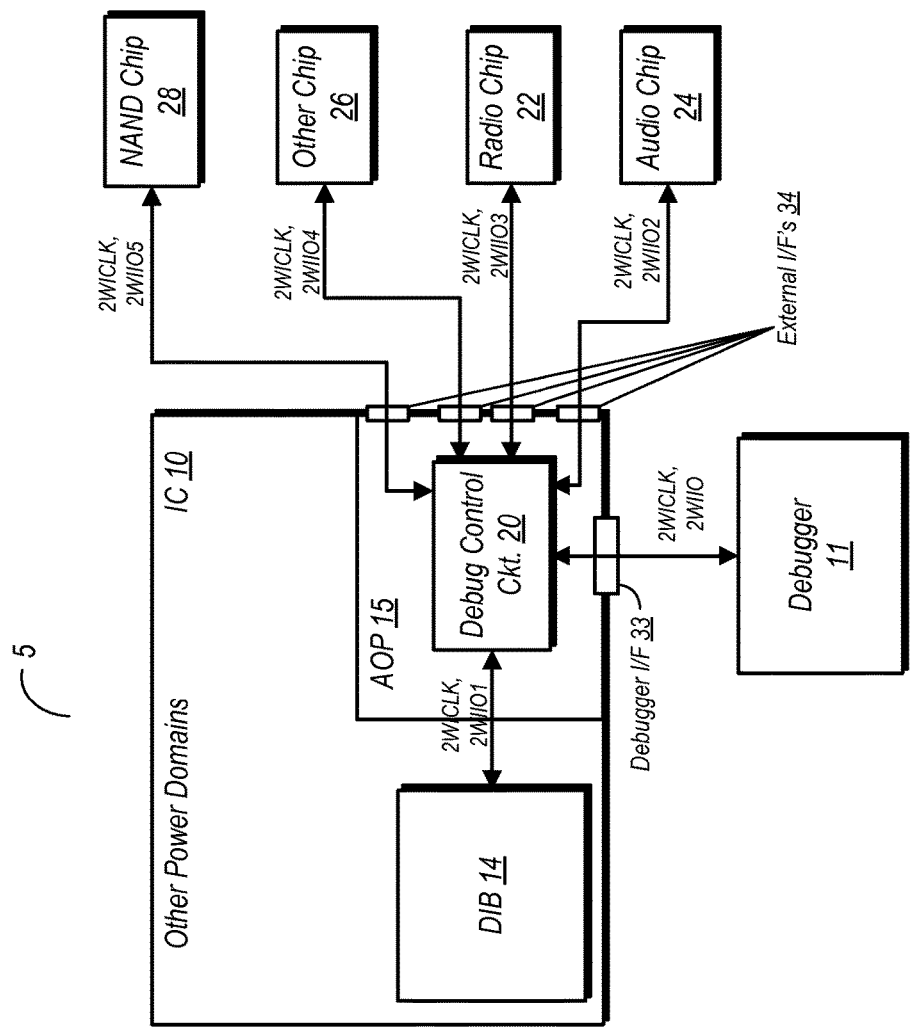
FIG. 1 is a block diagram of one embodiment of a system having an SoC configured to be coupled to an external debugger.

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component.

DETAILED DESCRIPTION OF EMBODIMENTS

FIG. 1 is a block illustrating one embodiment of a system having an SoC configured to be coupled to an external debugger. In the embodiment shown, system 5 includes an IC 10, which is an SoC. System 5 also includes a number of external circuits, including radio chip 22, audio chip 24, NAND chip 28, and at least one other chip 26.

Radio chip 22 may be a radio transceiver configured to both send and receive radio communications. NAND chip 28 may include NAND flash memory and various circuitry to support read and write access thereto. Other chip 26 may be any other type of peripheral chip, such as a display support chip, or a chip to support a particular type of bus interface (e.g., universal serial bus, or USB).

IC 10 in the embodiment shown includes an always-on processor (AOP) 15 and a debug interface block (DIB) 14. AOP 15 and DIB 14 are implemented in different power domains. AOP 15 may be implemented in a power domain that remains powered on at all times that IC 10 itself is receiving power. In contrast the power domain in which DIB 14 is implemented is one of one or more power domains on IC 10 that may be power-gated, i.e. power may be removed therefrom even if IC 10 is otherwise receiving power. This may allow DIB 14 (and other circuitry in power-gated domains) to be placed into a sleep mode. As will be explained below, communications between debugger 11 and any of the various external circuits noted above may, once established, bypass DIB 14, including those times when DIB 14 is powered down.

AOP 15 in the embodiment shown includes a debug control circuit 20. Among the functions provided by debug control circuit 20 is control of various operations related to debugging. Debugging may be performed in the hardware design phase to test the hardware functionality of IC 10 as well as to locate any errors that might be present. Debugging may also be performed to ensure software executes properly on the system and to find any software bugs that may be present.

Another function that may be performed by debug control circuit 20 is to act as a bridge between an external debugger 11 and DIB 14, and further, between debugger 11 and the various external circuits (chips) shown in the drawing. By acting as a bridge, debug control circuit 20 may allow communications between debugger 11 and the various external circuits to bypass DIB 14 after their initial establishment.

Debug control circuit 20 in the embodiment shown may be coupled to an external debugger 11 via debugger interface 33. The debugger 11 may be used to input test stimulus into the various components of system 5 as shown here as well as to receive data for analysis. Through debug control circuit 20 and DIB 14, debugger 11 may gain access to other functional circuits within IC 10. Debugger 11 may also gain access to functional units within the other external circuits via debug control circuit 20, via external interfaces 34.

Various types of interface protocols may be used to implement debugger interface 33 and external interfaces 34. In one embodiment, these interfaces may be implemented as two-wire interfaces (2WI). As its name suggests, the 2WI interface utilizes only two pins. A first pin is used to convey test mode selected (2WIIO) signals, while a second pin is used to convey a test clock (2WICLK) signal. Debug control circuit 20 may convey a common 2WICLK signal to DIB 14 and to each of the external circuits shown in the drawing. In addition, debug control circuit 20 may facilitate communications via separate and independent versions of the 2WIIO signal (e.g., 2WIIO1, 2WIIO2 etc.) to and from DIB 14 and the various external circuits.

When communications are to be established between debugger 11 and another device (DIB 14 or any of the external circuits, such as radio chip 22), the initial configuration of the connection may be performed by debug control circuit 20. During communications between debugger 11 and one of the external circuits, DIB 14 may be bypassed. Thus, in contrast to prior art embodiments in which a DIB is involved in all communications between a debugger and other devices (internal and external to the chip), the presence here of debug control circuit 20, operating as a bridge, enables communications between debugger 11 and other devices without any involvement being required of DIB 14.

As noted above, DIB 14 and debug control circuit 20 are implemented in separate power domains. As also noted, debug control circuit 20 may nevertheless act as a bridge between debugger 11 and each of the external circuits (e.g., radio chip 22, audio chip 24, etc.) even if DIB 14 is powered down. That is, in addition to being able to bypass DIB 14 during communications between debugger 11 and an external circuit when DIB 14 is powered on, communications may also continue, once established, if DIB 14 is powered down. Generally speaking, the power status of any device (DIB or external circuits) may change during operation without affecting communications between the debugger and any other device. For example, communications established between the debugger 11 and any of the external circuits may be conducted while bypassing DIB 14 and continuing even if DIB 14 is subsequently powered down.

Furthermore, some of the external circuits may also be powered down during communications between debugger 11 and another external circuits. For example, debug control circuit 20 may facilitate communications between debugger 11 and radio chip 22 even though DIB 14 and each of the remaining external circuits (e.g., audio chip 24, etc.) are powered down. This is in contrast to prior art embodiments in which all debugger communications are routed through a DIB and/or which all devices are required to be powered up. Furthermore, various ones of the external circuits may be powered down subsequent to establishing communications without affecting other connections. For example, consider a scenario in which debugger 11 is communicating with radio chip 22 and audio chip 24 through established connections. At some time after communications have commenced, audio chip 24 may be powered down. However, the connection from debugger 11 and radio chip 22 may continue to operate unaffected by the change in status of audio chip 24, with communications continuing to be conducted through debug control circuit 20 while bypassing DIB 14. This is in contrast to prior art embodiments wherein changes in power status to one connection could not be conducted without affecting the other connections. In such prior art embodiments, such a change of status would necessitate re-establishment of each of the remaining connections. Accordingly, the presence of debug control circuit 20 provides flexibility not found in prior art embodiments.

Figure 2:
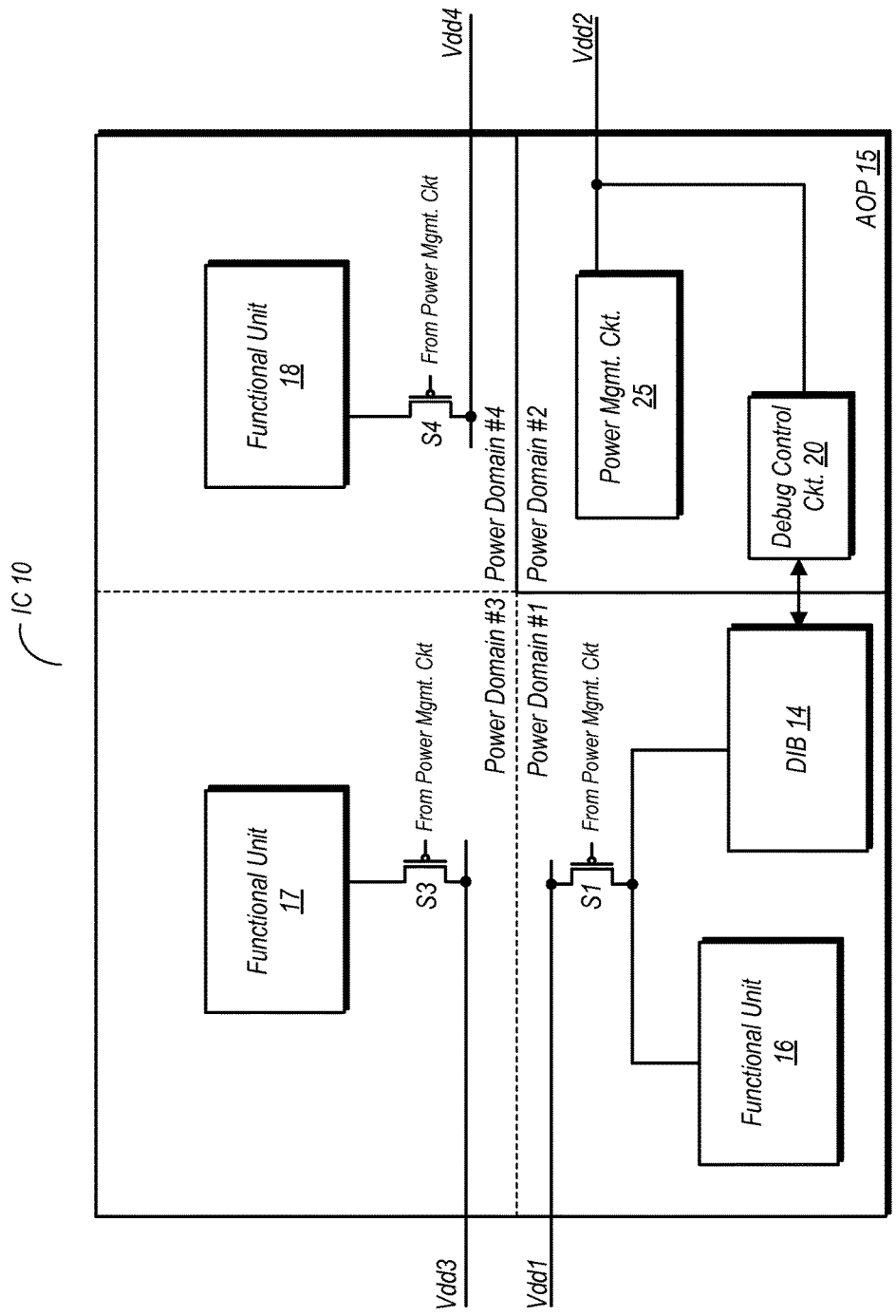
FIG. 2 is a block diagram of one embodiment of the SoC that may be implemented in the system of FIG. 1.

FIG. 2 is a block diagram of one embodiment of the SoC that may be implemented in the system of FIG. 1. In the embodiment shown, IC 10 includes four different power domains. Power domain #1 includes DIB 14 and a functional unit 16. Power domain #2 includes AOP 15, with debug control circuit 20 and a power management circuit 25 implemented therein. Power domain #2 is the only power domain in this embodiment of IC 10 that is not power gate-able, and thus the circuitry therein remains powered on any time IC 10 is receiving power via Vdd2. Power domain #3 includes functional unit 17, while power domain #4 includes functional unit 18. The functional units may comprise various circuitry to carry out the operation of IC 10. These units may include, but are not limited to, processor cores, graphics processors, I/O circuits, and so on.

As noted above, power management circuit 25 is included as part of AOP 15. Among the functions performed by power management circuit 25 is controlling whether power is provided to the circuits in power domains #1, #3, and #4. In some embodiments, power management circuit 25 may monitor the functional units in these other power domains for indications of idleness or a general level of activity. Embodiments are also possible and contemplated in which indications are provided from circuitry within these power domains to power management circuit 25. If power management circuit 25 determines that circuitry within a power domain is idle, either through a received indication or from its own monitoring, it may deactivate a corresponding power switch to remove power therefrom (i.e., place the circuitry into a "sleep mode"). Each of the power domains includes at least one power switch (e.g., S1 in power domain #1) which may be deactivated to remove power from the circuitry within that domain.

Irrespective of the current power states (active or in sleep mode) of the other power domains, debug control circuit 20 may continue to support communications with an external debugger 11 as well as with external circuits such as the external chips shown in FIG. 1. This applies after a communications link or connection has been established between debugger 11 and an external circuit, and may remain true even if DIB 14 is powered down subsequent to establishing a connection.

Figure 3:
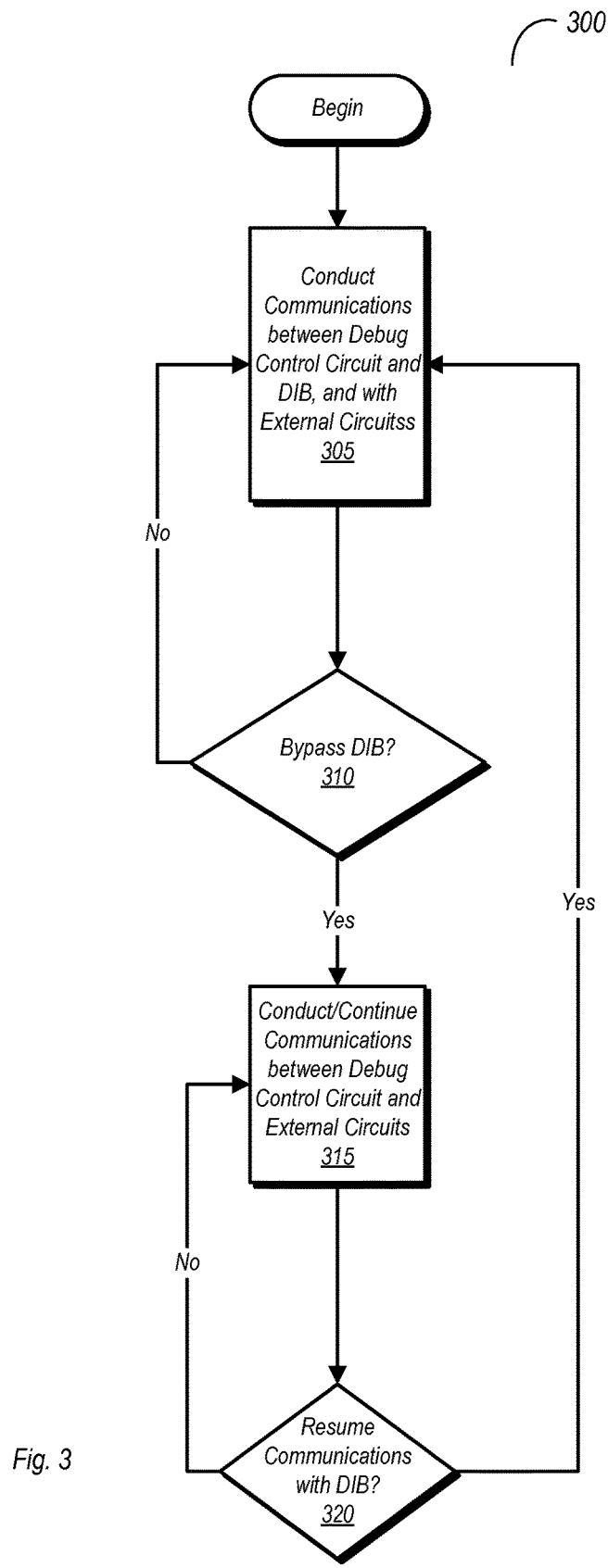
FIG. 3 is a flow diagram illustrating one embodiment of a method for operating a circuit configured to provide a bridge function between a debugger and a number of external circuits.

FIG. 3 is a flow diagram illustrating one embodiment of a method for operating a circuit configured to provide a bridge function between a debugger and a number of external circuits. Method 300 as shown in FIG. 3 may be performed using various embodiment of the hardware discussed above in reference to FIGS. 1 and 2. It is also possible and contemplated that method 300 can be performed by hardware embodiments not explicitly discussed herein.

Method 300 begins with the conducting of communications between a debug control circuit and a DIB of an IC and one or more circuits external to the IC (block 305). The debug control circuit may act as a bridge between an external debugger and the DIB, and thus facilitate communications there between. At some points during operation, the DIB may be inactive, and thus not involved in any communications with the debug control circuit. In such instances, the DIB may be bypassed (block 315, yes). During operation with the DIB bypassed, communications may nevertheless be conducted between the DIB and the circuits external to the IC (block 315). The external circuits may be other IC's, such as a radio chip, an audio chip, or any other chip coupled to the IC in which the DIB and the debug control circuit are implemented. When inactive, the DIB may be placed into a sleep mode (e.g., clock gated, and in some cases power gated as well).

IF the DIB is not bypassed (block 310, no), communications with the debug control circuit may continue (block 305). Communications between the external circuits and the debug control circuit may also be conducted concurrent with communications between the debug control circuit and the DIB.

If the DIB is currently bypassed but is to resume communications, (block 320, yes), then the method may return to block 305. This may include waking the DIB from a sleep state if it has been power gated and/or clock gated. Otherwise, if the DIB may continue to be bypassed (block 320, no), then the method may return to block 315, with communications between the debug control circuit and one or more of the external circuits continuing.

Various embodiments of the method and apparatus described above may provide certain advantages over previous embodiments. For example, in previous embodiments utilizing a debug access port (DAP) with an SWD interface, all devices, including the DAP, had to remain powered on. Thus, in such embodiments, communications with external devices when the DAP was in a sleep mode were not possible. In contrast, various method and apparatus embodiments discussed with reference to FIGS. 1-3 may allow for communications between the IC having the debug control circuit and the DIB even when the DIB itself is powered down or otherwise inactive. Moreover, the debugger need not be connected each of the external circuits separately, but instead can connect to each through the debug control circuit. Third, external devices may be powered up and/or down at any time during operation, irrespective of the status of the DIB.

Figure 4:
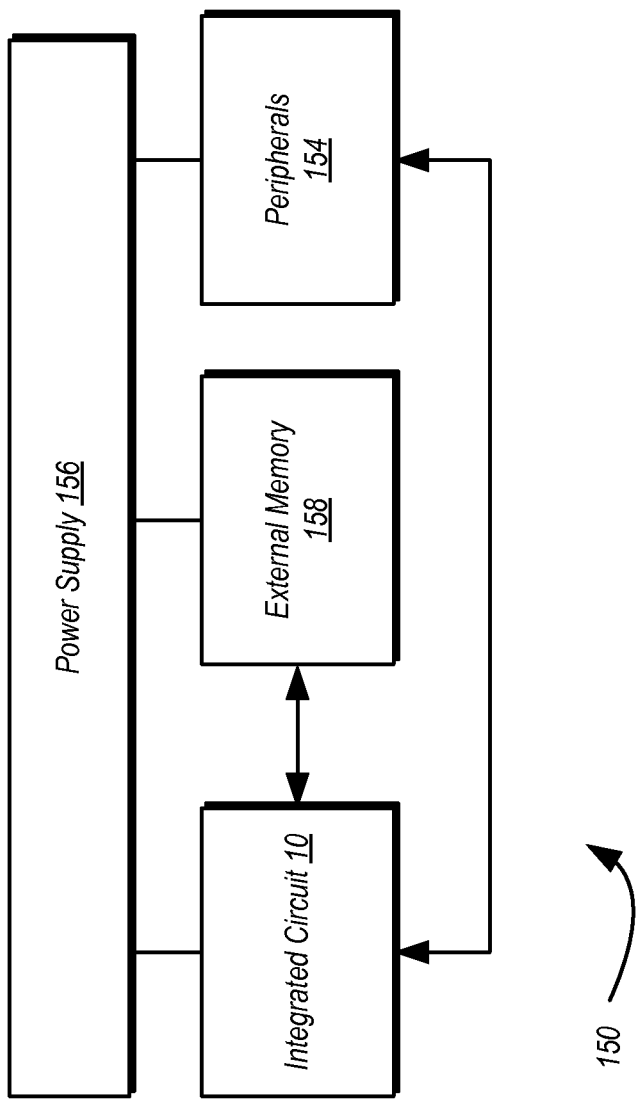
FIG. 4 is a block diagram of one embodiment of an exemplary system.

Turning next to FIG. 4, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs ), etc.

Numerous variations and modifications will become apparent to those skilled in the art once the above disclosure is fully appreciated. It is intended that the following claims be interpreted to embrace all such variations and modifications.

What is claimed is:

1. An integrated circuit (IC) comprising:
a debug control circuit;
a debug interface block (DIB);
a debugger interface configured to couple the debug control circuit to an external debugger; and
a plurality of external interfaces each configured to couple the debug control circuit to a corresponding one of a plurality of external circuits, wherein the debug control circuit is configured to establish a connection between the external debugger and at least one of the plurality of external circuits, and wherein, and wherein subsequent to the debug control circuit establishing the connection, the debug control circuit is configured to facilitate communications between the at least one of the plurality of external circuits and the debugger while bypassing the DIB.

2. The integrated circuit as recited in claim 1, wherein the DIB is in a first power domain and wherein the debugger interface and the debug control circuit are in a second power domain, and wherein the IC further comprises a power management circuit, wherein the power management circuit is implemented in the second power domain, and wherein the power management circuit is configured to power down circuitry in the first power domain, including the DIB.

3. The integrated circuit as recited in claim 2, wherein the power management circuit is configured to perform power-gating of the first power domain, and wherein the second power domain is configured to retain power during operation of the integrated circuit, and wherein the debug control circuit is configured to facilitate communications between the external circuits and the debugger subsequent to powering down the DIB.

4. The integrated circuit as recited in claim 2, wherein debug control circuit is continued to facilitate communications between the debugger and a selected one of the plurality of external circuits irrespective of a change of power status of the DIB or one or more additional ones of the plurality of external circuits.

5. The integrated circuit as recited in claim 1, wherein the debug control circuit and the debugger interface are implemented in an always-on processor (AOP), wherein the AOP is configured to remain powered on during operation of the integrated circuit.

6. The integrated circuit as recited in claim 1, wherein the debug control circuit is configured to receive a first test mode select signal and a test clock signal from the external debugger.

7. The integrated circuit as recited in claim 6, wherein the debug control circuit is coupled to convey the test clock signal to the DIB and through each of the plurality of external interfaces, and wherein the debug control circuit is further coupled to independently convey independent instances of a test mode select signal through each of the external interfaces.

8. The integrated circuit as recited in claim 1, wherein the integrated circuit includes a plurality of power domains including the first and second power domains, wherein each of the power domains with the exception of the second power domain is power gate-able, and wherein the debug control circuit is configured to conduct communications through each of the external interfaces coupled thereto irrespective of whether power domains other than the second power domain are receiving power.

9. A method comprising:
a debug control circuit implemented in a first power domain of an integrated circuit (IC) communicating with a debug interface block (DIB) implemented in a second power domain of the IC;
the debug control circuit establishing connections with one or more circuits external to the IC, wherein establishing connection with the one or more circuits external to the IC is conducted concurrent with communications between the debug control circuit and the DIB; and
an external debugger communicating with the one or more circuits external to the IC subsequent to establishing the communications with the one or more circuits external to the IC, wherein communications between the external debugger and the one or more circuits external to the IC are conducted while bypassing the DIB.

10. The method as recited in claim 9, further comprising the debug control circuit conveying a common test clock signal to each of the external circuits and individual instances of a test mode select signal to each of the external circuits.

11. The method as recited in claim 10, further comprising the debug control circuit conveying to the DIB the common test clock signal and an individual instance of the test mode signal.

12. The method as recited in claim 9, further comprising:
the first power domain remaining powered on during operation of the IC;
a power management circuit in the first power domain selectively removing and providing power to the second power domain, including the DIB; and
continuing communications between the debugger and the one or more circuits external to the IC irrespective of whether the DIB is powered on.

13. The method as recited in claim 9, further comprising continuing communications between the debugger and a first one of the circuits external to the IC irrespective of a change of power status of a second one of the circuits external to the IC.

14. A system comprising:
a system on a chip (SoC) having a debug interface block (DIB) in a first power domain and an always-on processor (AOP) in a second power domain,
wherein the AOP includes a debug control circuit coupled to communicate with the DIB;
a debugger interface in the second power domain configured to couple the debug control circuit to an external debugger; and
a plurality of external circuits each coupled to the debug control circuit via corresponding ones of a plurality of external debug interfaces implemented on the SoC;
wherein the debug control circuit is configured to establish a connection between the external debugger and one or more of the plurality of external circuits responsive to one or more corresponding requests, and wherein, subsequent to establishing the connection, the debug control circuit is configured to facilitate communications between the debugger and the one or more of the plurality of external circuits while bypassing the DIB.

15. The system as recited in claim 14, further comprising a power management circuit implemented in the second power domain, wherein the power management circuit is configured to remove power from the first power domain, including the DIB.

16. The system as recited in claim 15, wherein circuitry in the second power domain including the AOP is configured to remain powered on during operation of the IC.

17. The system as recited in claim 14, wherein subsequent to establishing a connection between the external debugger and a selected one of the plurality of external circuits, the debug control circuit is continued to facilitate communications between the debugger and the selected one of the plurality of external circuits irrespective of a change of power status of the DIB or one or more additional ones of the plurality of external circuits.

18. The system as recited in claim 14, wherein the debug control circuit is configured to receive a first test mode select signal and a test clock signal from the external debugger.

19. The system as recited in claim 18, wherein the debug control circuit is coupled to convey the test clock signal to each of the plurality of external circuits through corresponding ones of each of the plurality of external interfaces, and wherein the debug control circuit is further coupled to independently convey independent instances of a test mode select signal to each of the plurality of externals circuits through corresponding ones of each of the plurality of external debug interfaces.

20. The system as recited in claim 19, wherein the debug control circuit is coupled to convey the test clock signal and an individual instance of the test mode select signal to the DIB when the first power domain is receiving power.

* * * * *